US012213274B1

(12) United States Patent
Tsorng et al.

(10) Patent No.: US 12,213,274 B1
(45) Date of Patent: Jan. 28, 2025

(54) LIE-FLAT CABLE CLIP

(71) Applicant: Quanta Computer Inc., Taoyuan (TW)

(72) Inventors: Yaw-Tzorng Tsorng, Taoyuan (TW); Ming-Lung Wang, Taoyuan (TW); Pei-Jung Hsieh, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/475,179

(22) Filed: Sep. 26, 2023

(51) Int. Cl.
*H05K 7/14* (2006.01)
*F16B 2/22* (2006.01)

(52) U.S. Cl.
CPC ............. *H05K 7/1491* (2013.01); *F16B 2/22* (2013.01)

(58) Field of Classification Search
CPC ...... H05K 7/1491; H05K 7/14; H05K 5/0247; F16B 2/22; H02G 3/32
USPC .......................................................... 248/73
See application file for complete search history.

(56) References Cited

U.S. PATENT DOCUMENTS

| | | | | |
|---|---|---|---|---|
| 7,500,867 B1 * | 3/2009 | Doglio | ............... | H01R 13/5841 439/456 |
| 7,837,158 B1 * | 11/2010 | Chen | ....................... | F16L 3/123 248/73 |
| 10,589,691 B2 * | 3/2020 | Rouleau | ..................... | B60P 3/00 |
| 11,421,803 B2 * | 8/2022 | Arnold | ..................... | F16L 3/222 |
| 11,570,923 B1 * | 1/2023 | Tsorng | ..................... | H05K 7/14 |
| 11,817,684 B2 * | 11/2023 | Martin | ................. | H02G 3/0456 |
| 12,010,811 B1 * | 6/2024 | Chen | ................... | H05K 7/1491 |
| 2006/0124804 A1 * | 6/2006 | Lin | ......... | F16M 11/22 248/65 |
| 2006/0180716 A1 * | 8/2006 | Tan | .......... | H02G 3/32 248/68.1 |
| 2009/0294600 A1 * | 12/2009 | Dodge | ...................... | F16L 3/12 248/73 |
| 2012/0145837 A1 * | 6/2012 | Li | ........................... | H02G 3/32 248/74.2 |
| 2012/0145838 A1 * | 6/2012 | Chiu | ........................ | H02G 3/32 248/74.2 |

* cited by examiner

*Primary Examiner* — Todd M Epps
(74) *Attorney, Agent, or Firm* — NIXON PEABODY LLP

(57) ABSTRACT

A lie-flat cable clip is disclosed that has a base and first and second hooks. The first hook and second hooks are coupled to the base and are rotatable between open and closed clip positions. The first hook has a first arm and a first extension. The first arm is connected to the base at a proximal end and is connected to the first extension at a distal end. The first extension has an aperture. The second hook has a second arm and a second extension. The second arm is connected to the base at a proximal end and is connected to the second extension at a distal end, the second extension having a projection. The first hook and the second hook are configured to couple together in the closed clip position and to lie flat to be co-planar with the base in the open clip position.

14 Claims, 5 Drawing Sheets

LIE-FLAT CABLE CLIP

FIELD OF THE INVENTION

The present invention relates generally to a structure for securing cables and, more specifically, to a lie-flat cable clip for securing cables within a computing system.

BACKGROUND OF THE INVENTION

Computing systems, and particularly server computing systems, can include many cables. Conventional cable clips are used to organize the cables and arrange the routing of the cables, such as within the chassis of the computing system. However, conventional cable clips do not have a closed structure, perhaps due to the length, thickness, and/or number of cables. Cables often are not securely fixed within conventional cable clips, which may cause the cable clip to break or cause the cables to fall out. Even further, in the case of no cable routing for a specific conventional cable clip, conventional cable clips cannot be flattened. Thus, the space (e.g., height space) occupied by the conventional cable clip may cause difficulties when disassembling or assembling the computing system.

The present disclosure is directed to solving the above-referenced problems by providing a lie-flat cable clip.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a cable clip for routing one or more cables of a computing system is disclosed. The cable clip includes a base, a first hook, and a second hook. The first hook is coupled to the base and is rotatable between an open clip position and a closed clip position. The first hook has a first arm and a first extension. The first arm is connected to the base at a proximal end and is connected to the first extension at a distal end. The first extension has an aperture. The second hook is coupled to the base and is rotatable between the open clip position and the closed clip position. The second hook has a second arm and a second extension. The second arm is connected to the base at a proximal end and is connected to the second extension at a distal end. The second extension has a projection. The first hook and the second hook are configured to couple together in the closed clip position to form a cable area by the projection fitting within the aperture. The first arm and the second arm also are configured to lie flat to be co-planar with the base with the first hook and the second hook in the open clip position. The cable area is an interior space for receiving one or more of the routing cables of the computing system.

According to one aspect of the above embodiment, the second extension has an exterior surface, facing away from the base, from which the projection extends. Alternatively, the second extension can have an interior surface, facing toward the base, from which the projection extends.

According to one aspect of the above embodiment, the first hook is coupled to the base at a first hinge and the second hook is connected to the base at a second hinge. The cable clip can further include a first spring in the first hinge configured to urge the first hook in the open clip position. The cable clip can further include a second spring in the second hinge configured to urge the second hook in the open clip position. The first spring and the second spring can be torsion springs.

According to one aspect of the above embodiment, the first hook can be made of rubber, metal, and/or plastic. The second hook can be made of rubber, metal, and/or plastic.

According to one aspect of the above embodiment, the base can be configured to mount to a computing system. In specific aspects, the base can be configured to mount to a chassis or a board of the computing system.

According to one aspect of the above embodiment, the first hook includes a first hinge between the first arm and the first extension, and the second hook includes a second hinge between the second arm and the second extension. According to this aspect, the cable clip can include a first spring in the first hinge configured to urge the first extension to be co-planar with the first arm. The cable clip can further include a second spring in the second hinge configured to urge the second extension to be co-planar with the second arm.

According to one aspect of the above embodiment, the first extension extends perpendicular to the first arm and the second extension extends perpendicular to the second arm. According to this aspect, the first arm can extend perpendicular to the base with the first hook in the closed clip position, and the second arm can extend perpendicular to the base with the second hook in the closed clip position.

According to one embodiment of the present disclosure, a cable clip for routing one or more cables of a computing system is disclosed. The cable clip includes a base configured to mount to a chassis or a board of the computing system. The cable clip further includes a first hook coupled to the base at a first hinge and rotatable about the first hinge between an open clip position and a closed clip position. The first hook has a first arm and a first extension that is perpendicular to the first arm in the closed clip position. The first arm is connected to the base at a proximal end and is connected to the first extension by a third hinge at a distal end. The first extension has an aperture. The cable clip further includes a second hook coupled to the base at a second hinge and rotatable about the second hinge between the open clip position and the closed clip position. The second hook has a second arm and a second extension that is perpendicular to the second arm in the closed clip position. The second arm is connected to the base at a proximal end and is connected to the second extension by a fourth hinge at a distal end. The second extension has a projection. The cable clip further includes a first spring in the first hinge configured to urge the first hook in the open clip position. The cable clip further includes a second spring in the second hinge configured to urge the second hook in the open clip position. The cable clip further includes a third spring in the third hinge configured to urge the first extension to be co-planar with the first arm. The cable clip further includes a fourth spring in the fourth hinge configured to urge the second extension to be co-planar with the second arm. The first hook and the second hook are configured to couple together in the closed clip position to form a cable area by the projection fitting within the aperture. The first arm and the second arm are configured to lie flat to be co-planar with the base with the first hook and the second hook in the open clip position. The cable area is an interior space for receiving one or more of the routing cables of the computing system.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
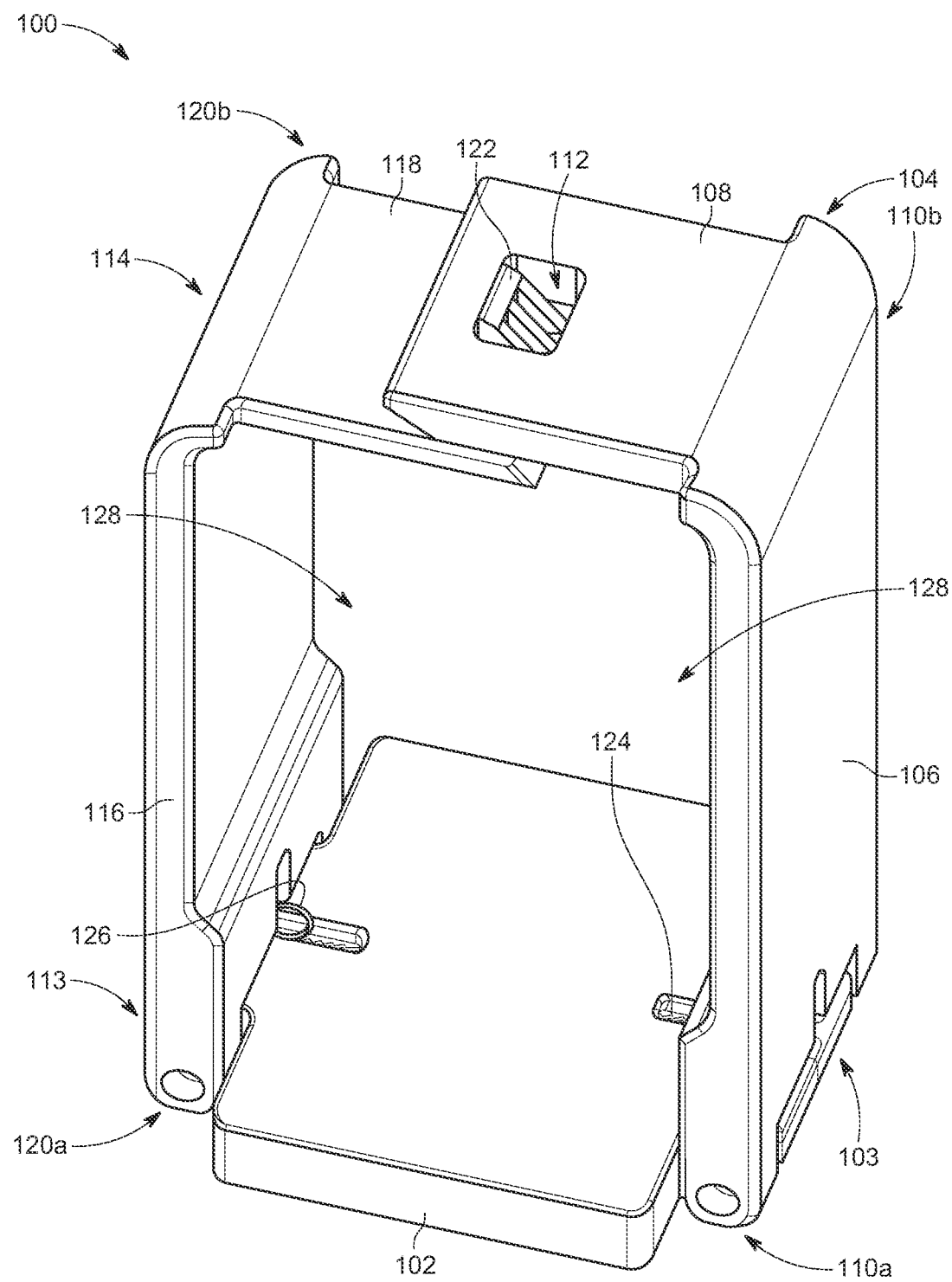
FIG. 1 shows a perspective view of a cable clip, according to an aspect of the present disclosure.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

The present disclosure is directed to a lie-flat cable clip that, when clasped, defines a cable area to secure cables. When not clasped, the cable clip of the present disclosure lies flat to free up additional space in the computing system when not in use securing cables. The cable clip includes two hooks that couple together when in the closed clip position and that lie flat when in the open clip position.

Figure 2:
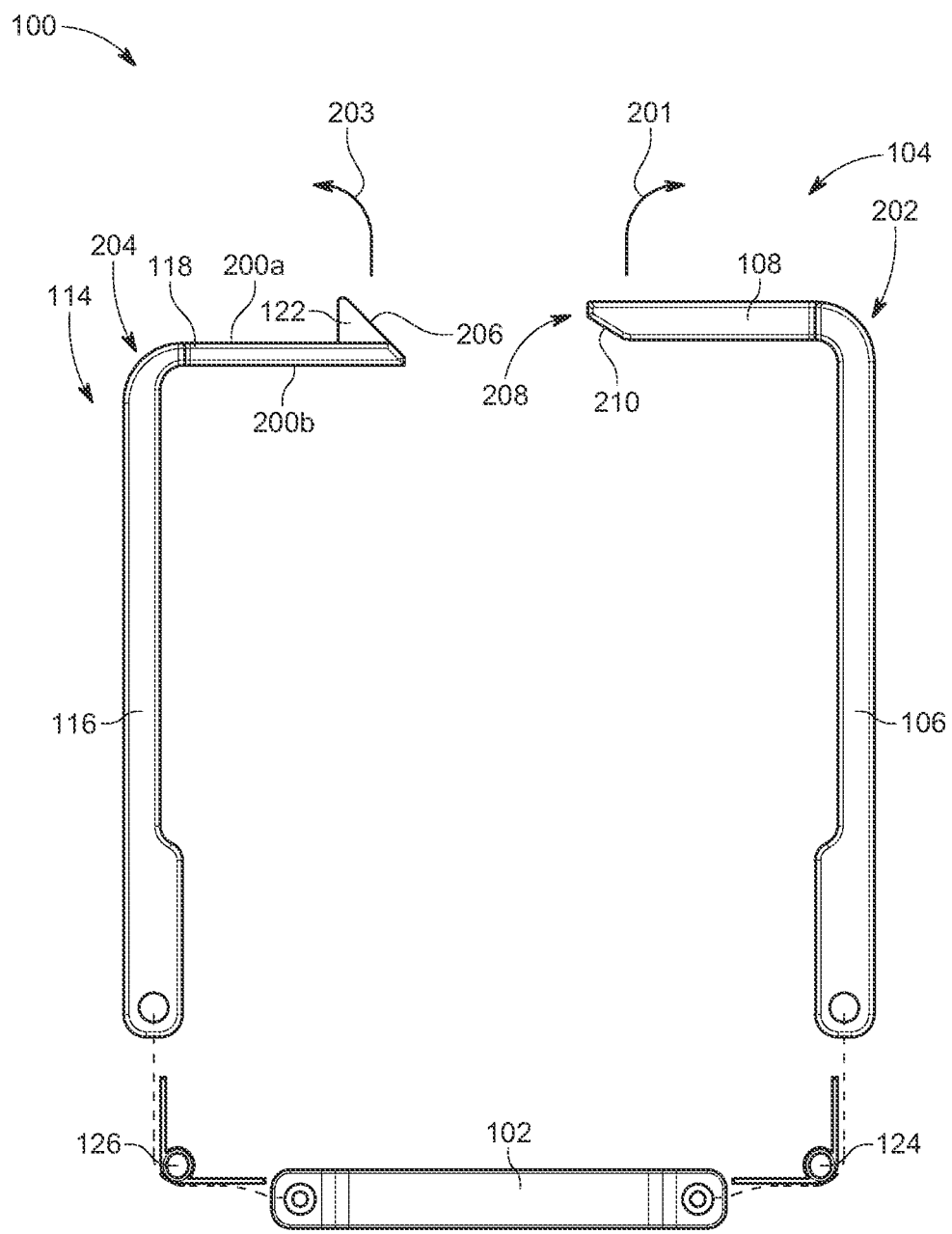
FIG. 2 shows a side exploded view of a cable clip, according to an aspect of the present disclosure.
Figure 5:
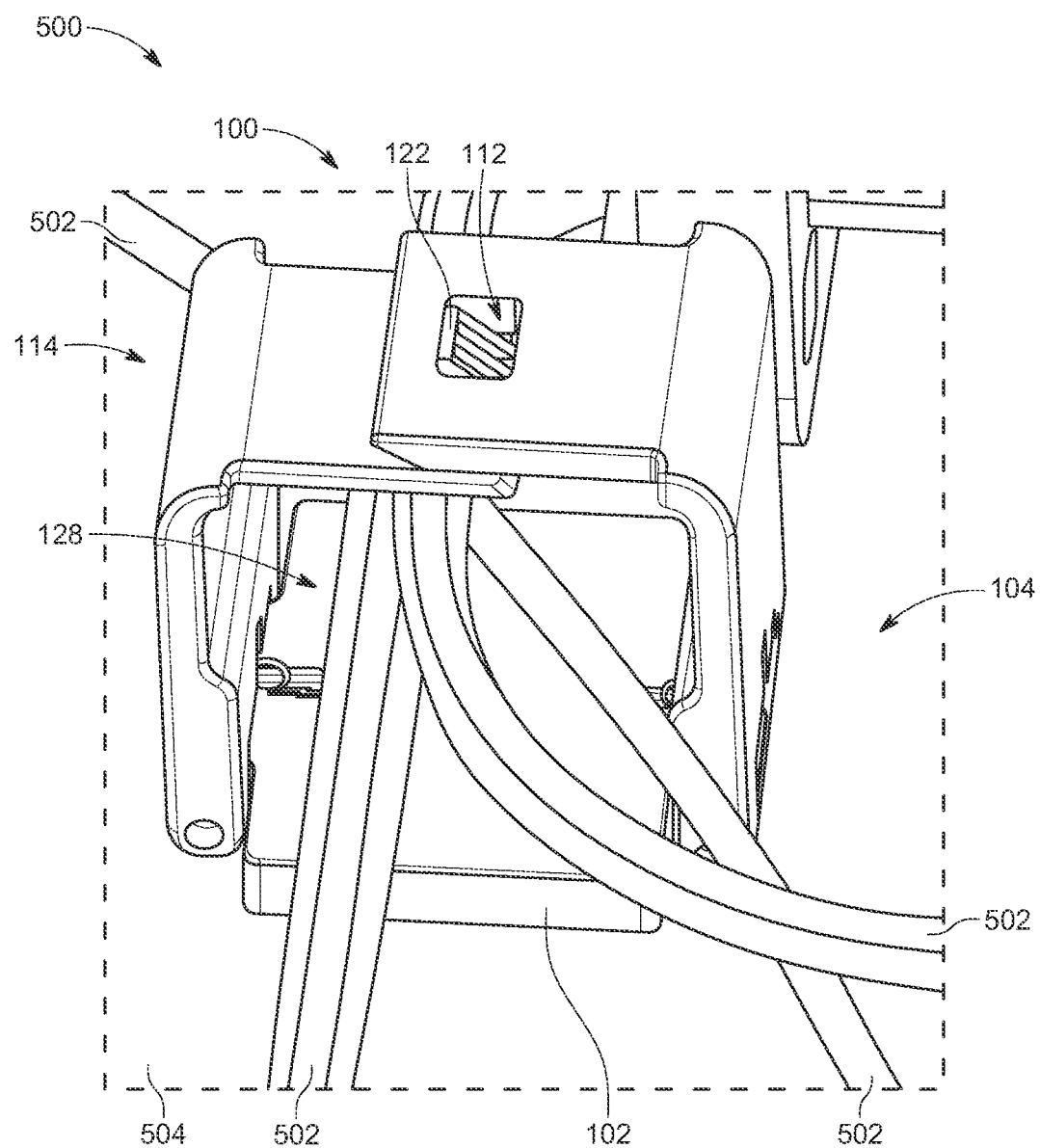
FIG. 5 shows a perspective view of a cable clip securing cables within a computing system, according to an aspect of the present disclosure.

Referring to FIGS. 1 and 2, shown are a perspective view and a side exploded view, respectively, of a cable clip 100, according to an aspect of the present disclosure. The cable clip 100 includes a base 102. The base 102 can be configured to mount to a computing system (FIG. 5). For example, the base 102 can be configured to mount to a chassis or a board (FIG. 5) of the computing system. The base 102 can be mounted by an adhesive or mechanical fastener (e.g., screw) to the computing system.

The cable clip 100 further includes a hook 104 coupled to the base 102 at a hinge 103. The hook 104 is rotatable between an open clip position (FIG. 3) and the closed clip position shown in FIG. 1. The hook 104 can be made of plastic, rubber, or metal.

The hook 104 has an arm 106 and an extension 108. The arm 106 is connected to the base 102 at its proximal end 110a and is connected to the extension 108 at its distal end 110b. The arm 106 is perpendicular to the base 102 with the hook 104 in the closed clip position. The extension 108 is perpendicular to the arm 106 and includes an aperture 112.

The cable clip 100 further includes a hook 114 coupled to the base 102 at a hinge 113. The hook 114 is rotatable between an open clip position (FIG. 3) and the closed clip position shown in FIG. 1. The hook 114 can be made of plastic, rubber, or metal.

The hook 114 has an arm 116 and an extension 118. The arm 116 is connected to the base 102 at its proximal end 120a and is connected to the extension 118 at its distal end 120b. The arm 116 is perpendicular to the base 102 with the hook 114 in the closed clip position. The extension 118 is perpendicular to the arm 116 and includes a projection 122. The projection 122 is configured to fit within the aperture 112 when the hook 104 and the hook 114 are in the closed clip position.

Figure 3:
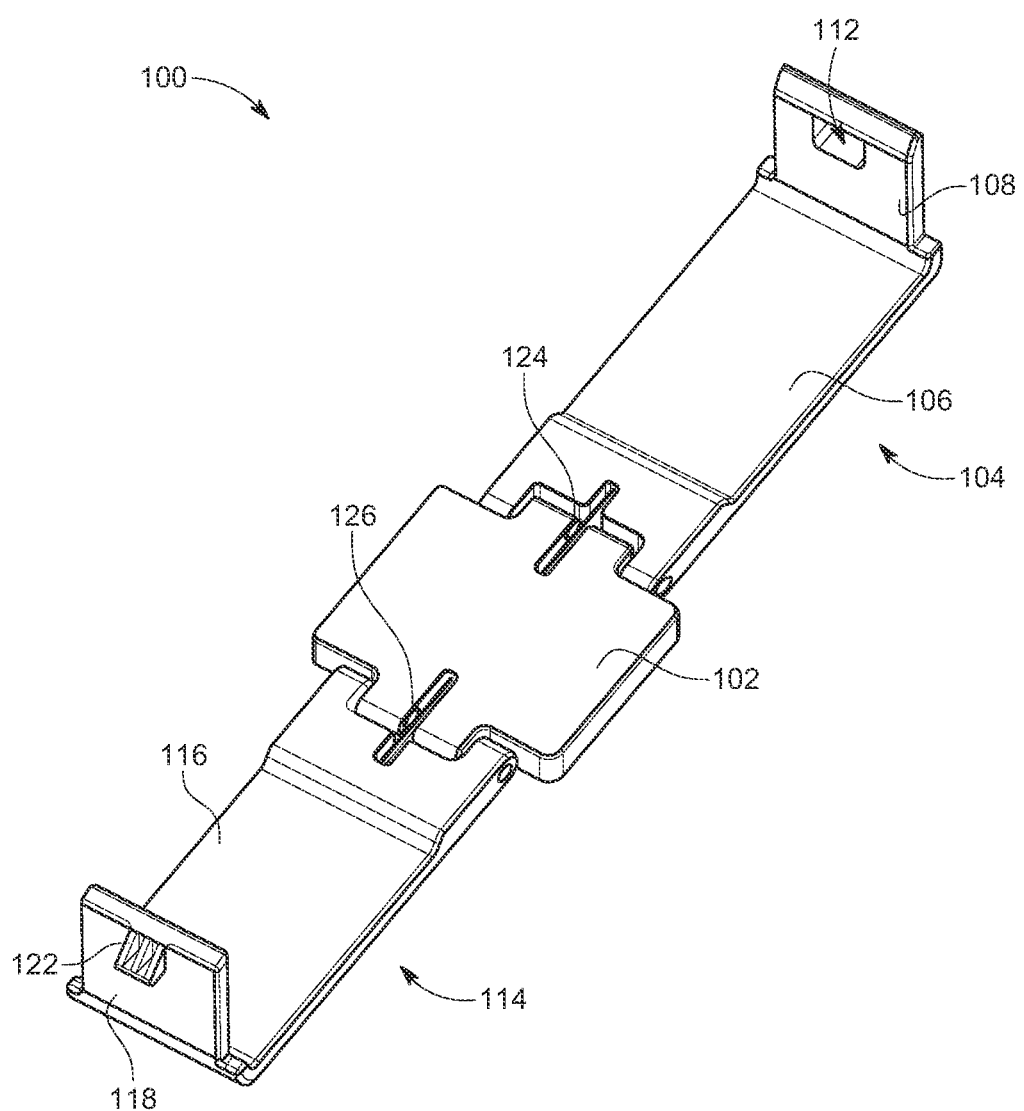
FIG. 3 shows a perspective view of a cable clip in a lie-flat, open clip position, according to an aspect of the present disclosure.

According to some implementations, the cable clip 100 can include a spring 124 at the hinge 103 between the arm 106 and the base 102. The spring 124 can be configured to urge the hook 104 into the lie-flat position (FIG. 3). This maintains pressure between the projection 122 and the aperture 112 when the cable clip 100 is in the closed clip position. In the alternative, or in addition, the cable clip 100 can include a spring 126 at the hinge 113 between the arm 116 and the base 102. The spring 126 can be configured to urge the hook 114 into the lie-flat position (FIG. 3) when the cable clip 100 is in the closed clip position. This maintains pressure between the projection 122 and the aperture 112. According to some aspects, the springs 124 and 126 can be torsion springs.

As shown in FIG. 1, the hooks 104 and 114 in the closed clip position define a cable area 128. The cable area 128 defines the interior space or area of the cable clip 100 that receives the one or more cables are retained (FIG. 5). With the hooks 104 and 114 in the closed clip position, the arms 106 and 116 are perpendicular to the base 102.

Referring to FIG. 2, as shown, the projection 122 extends from an exterior surface 200a of the extension 118. Alternatively, the projection 122 can extend from an interior surface 200b of the extension 118.

According to some aspects, where the arm 106 connects to the extension 108 can be a hinge 202 that allows the extension 108 to rotate in the direction of arrow 201 relative to the arm 106. The hinge 202 can be configured to allow the extension 108 to become co-planar with the arm 106. According to some implementations, the hinge 202 can include a spring, similar to the springs 124 and 126, that urges the arm 106 and the extension 108 to be co-planar. Similarly, where the arm 116 connects to the extension 118 can be a hinge 204 that allows the extension 118 to rotate in the direction of arrow 203 relative to the arm 116. The hinge 204 can be configured to allow the extension 118 to become co-planar with the arm 116. According to some implementations, the hinge 204 can include a spring, similar to the springs 124 and 126, that urges the arm 106 and the extension 108 to be co-planar.

According to some aspects, the projection 122 can have an angled front 206. The angled front 206 helps deflect the extension 108 and/or the extension 118 as the extensions 108 and 118 come together to couple the hooks 104 and 114. Similarly, or in the alternative, the distal tip 208 of the extension 108 can have an angled front 210. The angled front 210 helps deflect the extension 108 and/or the extension 118 as the extensions 108 and 118 come together to couple the hooks 104 and 114.

Referring to FIG. 3, the cable clip 100 is shown in the lie-flat, open clip position. Specifically, the arms 106 and 116 are co-planar with the base 102. The cable clip 100 can be in the open clip position when not being used to secure cables. The open clip position takes up less space (e.g., vertical space) than the cable clip 100 in the closed clip position (FIG. 1).

Figure 4:
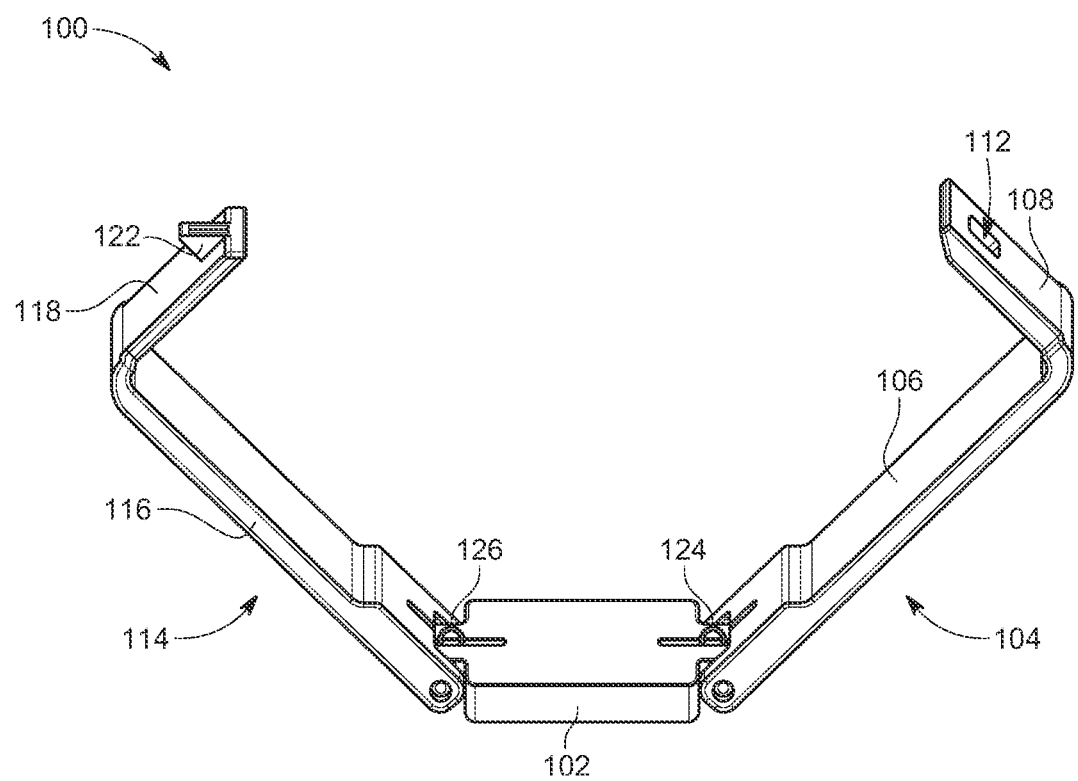
FIG. 4 shows a perspective view of a cable clip in the process of being clasped, according to an aspect of the present disclosure.

Referring to FIG. 4, the hooks 104 and 114 can be rotated towards each other from the lie-flat position shown in FIG. 3 to couple the projection 122 with the aperture 112 to retain cables within the defined cable area 128 (FIG. 1).

FIG. 5 shows a perspective view of the cable clip 100 securing cables 502 within a computing system 500, according to an aspect of the present disclosure. The base 102 can be coupled to, for example, the chassis 504 of the computing system 500. As shown, the cable clip 100 holds the cables 502 for proper routing of the cables 502 within the computing system 500. To release the cables 502, the projection 122 can simply be released from being retained within the aperture 112, and the hooks 104 and 114 can rotate back to the lie-flat position (FIG. 3).

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cable clip for routing one or more cables of a computing system, the cable clip comprising:
   a base;
   a first hook coupled to the base and rotatable between an open clip position and a closed clip position, the first hook having a first arm and a first extension, the first arm being connected to the base at a proximal end and being connected to the first extension at a distal end, the first extension having an aperture; and
   a second hook coupled to the base and rotatable between the open clip position and the closed clip position, the second hook having a second arm and a second extension, the second arm being connected to the base at a proximal end and being connected to the second extension at a distal end, the second extension having a projection,
   wherein the first hook and the second hook are configured to couple together in the closed clip position to form a cable area by the projection fitting within the aperture, and the first arm and the second arm are configured to lie flat to be co-planar with the base with the first hook and the second hook in the open clip position, the cable area being an interior space for receiving one or more of the routing cables of the computing system.

2. The cable clip of claim 1, wherein the second extension has an exterior surface, facing away from the base, from which the projection extends.

3. The cable clip of claim 1, wherein the second extension has an interior surface, facing toward the base, from which the projection extends.

4. The cable clip of claim 1, wherein the first hook is coupled to the base at a first hinge and the second hook is connected to the base at a second hinge.

5. The cable clip of claim 4, further comprising:
a first spring in the first hinge configured to urge the first hook in the open clip position; and
a second spring in the second hinge configured to urge the second hook in the open clip position.

6. The cable clip of claim 5, wherein the first spring and the second spring are torsion springs.

7. The cable clip of claim 1, wherein the first hook is made of rubber and/or plastic and the second hook is made of rubber and/or plastic.

8. The cable clip of claim 1, wherein the base is configured to mount to the computing system.

9. The cable clip of claim 8, wherein the base is configured to mount to a chassis or a board of the computing system.

10. The cable clip of claim 1, wherein the first hook includes a first hinge between the first arm and the first extension, and the second hook includes a second hinge between the second arm and the second extension.

11. The cable clip of claim 10, further comprising:
a first spring in the first hinge configured to urge the first extension to be co-planar with the first arm; and
a second spring in the second hinge configured to urge the second extension to be co-planar with the second arm.

12. The cable clip of claim 1, wherein the first extension extends perpendicular to the first arm and the second extension extends perpendicular to the second arm.

13. The cable clip of claim 12, wherein the first arm extends perpendicular to the base with the first hook in the closed clip position, and the second arm extends perpendicular to the base with the second hook in the closed clip position.

14. A cable clip for routing one or more cables of a computing system, the cable clip comprising:
a base configured to mount to a chassis or a board of the computing system;
a first hook coupled to the base at a first hinge and rotatable about the first hinge between an open clip position and a closed clip position, the first hook having a first arm and a first extension that is perpendicular to the first arm in the closed clip position, the first arm being connected to the base at a proximal end and being connected to the first extension by a third hinge at a distal end, the first extension having an aperture;
a second hook coupled to the base at a second hinge and rotatable about the second hinge between the open clip position and the closed clip position, the second hook having a second arm and a second extension that is perpendicular to the second arm in the closed clip position, the second arm being connected to the base at a proximal end and being connected to the second extension by a fourth hinge at a distal end, the second extension having a projection;
a first spring in the first hinge configured to urge the first hook in the open clip position;
a second spring in the second hinge configured to urge the second hook in the open clip position
a third spring in the third hinge configured to urge the first extension to be co-planar with the first arm; and
a fourth spring in the fourth hinge configured to urge the second extension to be co-planar with the second arm,
wherein the first hook and the second hook are configured to couple together in the closed clip position to form a cable area by the projection fitting within the aperture, and the first arm and the second arm are configured to lie flat to be co-planar with the base with the first hook and the second hook in the open clip position, the cable area being an interior space for receiving one or more of the routing cables of the computing system.

\* \* \* \* \*